United States Patent
Yoo et al.

(10) Patent No.: US 11,867,612 B2
(45) Date of Patent: Jan. 9, 2024

(54) OPTICAL INSPECTION APPARATUS

(71) Applicant: Samsung Display Co., LTD., Yongin-si (KR)

(72) Inventors: Je Won Yoo, Bucheon-si (KR); Basrur Veidhes, Yongin-si (KR); Dae Hyun Kim, Hwaseong-si (KR); Hyun Min Cho, Seoul (KR); Jong Won Lee, Hwaseong-si (KR); Joo Yeol Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 245 days.

(21) Appl. No.: 17/205,487

(22) Filed: Mar. 18, 2021

(65) Prior Publication Data
US 2021/0396654 A1  Dec. 23, 2021

(30) Foreign Application Priority Data

Jun. 22, 2020 (KR) .................. 10-2020-0075648

(51) Int. Cl.
*G01N 21/25* (2006.01)
*G02B 21/06* (2006.01)
(Continued)

(52) U.S. Cl.
CPC ....... *G01N 21/255* (2013.01); *G01N 21/1717* (2013.01); *G01R 31/2635* (2013.01);
(Continued)

(58) Field of Classification Search
CPC ....... G01N 21/1717; G01N 2021/1721; G02B 21/26; G02B 21/361; G01R 31/2635; G01R 31/2656
See application file for complete search history.

(56) References Cited

U.S. PATENT DOCUMENTS 5,091,691 A * 2/1992 Kamieniecki ...... G01R 31/2656
324/762.01
2013/0242565 A1* 9/2013 Arai .................. F21V 21/00
362/296.04
(Continued)

FOREIGN PATENT DOCUMENTS

JP  2006-275527      10/2006
JP  2015050312 A  *  3/2015
(Continued)

OTHER PUBLICATIONS

English translation of JP2006275527A. Acquired from Espacenet. (Year: 2006).*
(Continued)

*Primary Examiner* — Michael A Lyons
(74) *Attorney, Agent, or Firm* — KILE PARK REED & HOUTTEMAN PLLC

(57) ABSTRACT

An optical inspection apparatus includes a stage that supports a target substrate, the target substrate including a plurality of light emitting elements, a jig that applies an electrical signal to the target substrate, the jig including a regulation resistor, a microscope that generates magnified image data of the target substrate, a camera that captures the magnified image data to generate a color image of the target substrate, and an optical measurement unit that captures the magnified image data of the target substrate to generate a spectrum image and measure optical characteristics of the target substrate.

15 Claims, 19 Drawing Sheets

(51) Int. Cl.
*G02B 21/36* (2006.01)
*G01N 21/17* (2006.01)
*G02B 21/26* (2006.01)
*G01R 31/26* (2020.01)
*G01R 31/265* (2006.01)

(52) U.S. Cl.
CPC ......... *G01R 31/2656* (2013.01); *G02B 21/06* (2013.01); *G02B 21/26* (2013.01); *G02B 21/361* (2013.01); *G01N 2021/1721* (2013.01)

(56) References Cited

U.S. PATENT DOCUMENTS

| | | | |
|---|---|---|---|
| 2015/0355053 A1 | 12/2015 | Ji et al. | |
| 2018/0174931 A1* | 6/2018 | Henley | H01L 33/48 |
| 2021/0167249 A1* | 6/2021 | Yamamoto | H01L 33/30 |

FOREIGN PATENT DOCUMENTS

| | | |
|---|---|---|
| KR | 10-2007-0041491 | 4/2007 |
| KR | 10-1174755 | 8/2012 |
| KR | 10-1400757 | 5/2014 |
| KR | 10-2015-0081798 | 7/2015 |
| KR | 10-1861919 | 5/2018 |
| KR | 10-2038354 | 10/2019 |

OTHER PUBLICATIONS

English translation of KR101861919B1. Acquired from Espacenet. (Year: 2018).*
English translation of KR102038354B1. Acquired from Espacenet. (Year: 2019).*
International Search Report corresponding to International Application No. PCT/KR2021/007074 dated Sep. 10, 2021.
Written Opinion corresponding to International Application No. PCT/KR2021/007074 dated Sep. 10, 2021.

* cited by examiner

EDGn, EDG: EDG1, EDG2, EDG3

EDGn, EDG: EDG1, EDG2, EDG3

EDGn, EDG: EDG1, EDG2, EDG3

OPTICAL INSPECTION APPARATUS

CROSS-REFERENCE TO RELATED APPLICATION(S)

This application claims priority to and benefits of Korean Patent Application No. 10-2020-0075648 under 35 U.S.C. § 119 filed on Jun. 22, 2020 in the Korean Intellectual Property Office, the entire contents of which are incorporated herein by reference.

BACKGROUND

1. Technical Field

The disclosure relates to an optical inspection apparatus.

2. Description of the Related Art

The importance of display devices has steadily increased with the development of multimedia technology. Accordingly, various types of display devices such as an organic light emitting display (OLED), a liquid crystal display (LCD) and the like have been developed.

A display device is a device for displaying an image, and may include a display panel, such as an organic light emitting display panel or a liquid crystal display panel. Among them, the light emitting display panel may include light emitting elements, for example, light emitting diodes (LED), and examples of the light emitting diode may include an organic light emitting diode (OLED) using an organic material as a fluorescent material and an inorganic light emitting diode using an inorganic material as a fluorescent material.

Meanwhile, development is underway on an optical inspection apparatus for measurement of individual optical characteristics of light emitting elements that are small in size.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide an optical inspection apparatus for measuring optical characteristics of individual light emitting elements having a micro or nano size.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, there is provided an optical inspection apparatus that may include a stage that supports a target substrate, the target substrate including a plurality of light emitting elements; a jig that applies an electrical signal to the target substrate, the jig including a regulation resistor; a microscope that generates magnified image data of the target substrate; a camera that captures the magnified image data to generate a color image of the target substrate; and an optical measurement unit that captures the magnified image data of the target substrate to generate a spectrum image and measure optical characteristics of the target substrate.

In an embodiment, the spectrum image may include a plurality of pixels, and the optical measurement unit may measure an optical characteristic value corresponding to each of the plurality of pixels of the spectrum image.

In an embodiment, the microscope may include a plurality of lenses to magnify a surface of the target substrate, and a size of a pixel of the plurality of pixels of the spectrum image may be smaller than a size of a light emitting element of the plurality of light emitting elements included in the magnified image data.

In an embodiment, the optical measurement unit may include a two-dimensional spectroscope.

In an embodiment, a resistance of the regulation resistor of the jig may be greater than a resistance of a light emitting element of the plurality of light emitting elements.

In an embodiment, the target substrate may include a plurality of first pad portions respectively electrically connected to a first electrode of each of the plurality of light emitting elements, and the jig may include a plurality of first connectors respectively electrically connected to the plurality of first pad portions.

In an embodiment, the optical inspection apparatus may include a power supply unit that may apply an electrical signal to the jig.

In an embodiment, the regulation resistor of the jig may be electrically connected between each of the plurality of first connectors of the jig and the power supply unit.

In an embodiment, the target substrate may include a second pad portion electrically connected to a second electrode of the plurality of light emitting elements, and the jig may include a second connector electrically connected between the power supply unit and the second pad portion of the target substrate.

In an embodiment, a predetermined number of the plurality of light emitting elements may be electrically connected between one of the plurality of first pad portions of the target substrate and a second electrode of the plurality of light emitting elements.

In an embodiment, the optical inspection apparatus may include a light path adjusting unit that may adjust a light path of light of the magnified image data of the target substrate to the camera.

In an embodiment, the optical inspection apparatus may include a controller that may determine an occurrence of noise in the optical measurement unit, wherein the controller may receive the color image from the camera, may receive the spectrum image from the optical measurement unit, and may compare the color image with the spectrum image.

According to an embodiment, there is provided an optical inspection apparatus may include a stage that supports a target substrate, the target substrate including a plurality of light emitting elements; a laser that irradiates inspection light to the plurality of light emitting elements; a microscope that generates magnified image data of the target substrate; a camera that captures the magnified image data to generate a color image of the target substrate; and an optical measurement unit that captures the magnified image data of the target substrate to generate a spectrum image, and measure optical characteristics of the target substrate.

In an embodiment, the spectrum image may include a plurality of pixels, and the optical measurement unit may measure an optical characteristic value corresponding to each of the plurality of pixels of the spectrum image.

In an embodiment, the microscope may include a plurality of lenses to magnify a surface of the target substrate, and a size of a pixel of the plurality of pixels of the spectrum image may be smaller than a size of a light emitting element of the plurality of light emitting elements included in the magnified image data.

In an embodiment, the optical measurement unit may include a two-dimensional spectroscope.

In an embodiment, the plurality of light emitting elements may absorb light energy of the inspection light and may emit light.

In an embodiment, a wavelength of the inspection light may be smaller than a wavelength of light emitted by the plurality of light emitting elements.

In an embodiment, the optical inspection apparatus may include a light path adjusting unit that may adjust a light path of light of the magnified image data of the target substrate to the camera.

In an embodiment, the optical inspection apparatus may include a controller that may determine an occurrence of noise in the optical measurement unit, wherein the controller may receive the color image from the camera, may receive the spectrum image from the optical measurement unit, and may compare the color image with the spectrum image.

The optical inspection apparatus according to an embodiment may measure per-location optical characteristics of an individual light emitting element even in a case that the light emitting element as a measurement target may be a dot light source having a micro or nano size.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
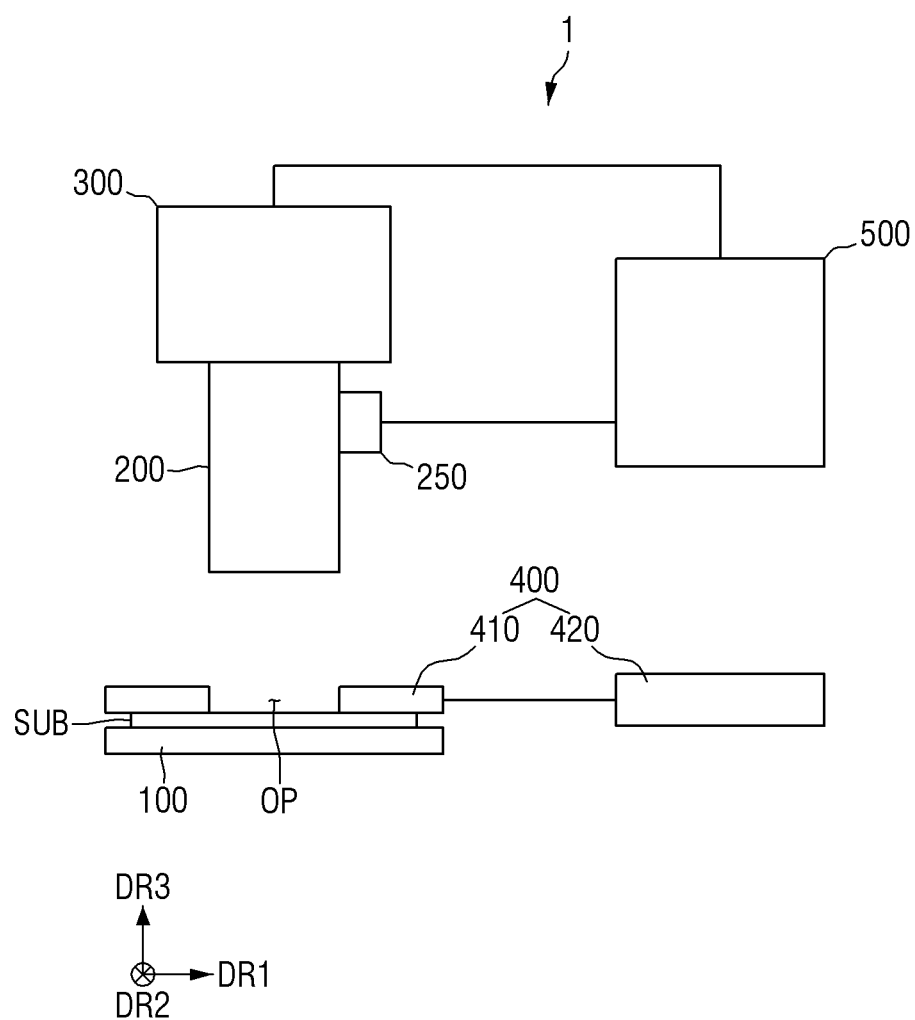
FIG. 1 is a schematic view of an optical inspection apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As used herein, the singular forms "a," "an," and "the" are intended to include the plural forms as well, unless the context clearly indicates otherwise.

It will be further understood that the terms "comprises" and/or "comprising" "includes" and/or "including" and "have" and/or "having" and their variations thereof as used herein specify the presence of stated features or elements, but do not preclude the presence or addition of one or more other features or elements.

It will also be understood that when a layer is referred to as being "on" another layer or substrate, it may be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

As used herein, the term "unit" and/or "module" denotes a structure or element as illustrated in the drawings and as described in the specification. However, the disclosure is not limited thereto. The term "unit" and/or "module" is not to be limited to that which is illustrated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, embodiments will be described with reference to the drawings.

Figure 2:
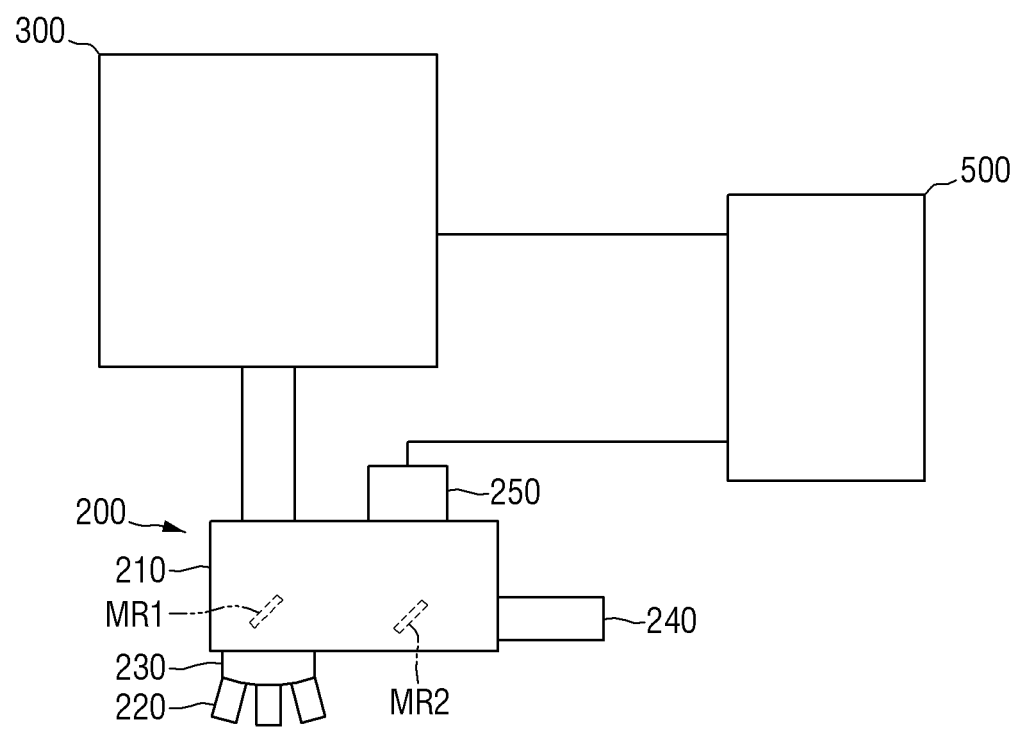
FIG. 2 is a schematic view of an optical unit and a controller according to an embodiment.

FIG. 1 is a schematic view of an optical inspection apparatus according to an embodiment. FIG. 2 is a schematic view of an optical unit and a controller according to an embodiment.

Referring to FIGS. 1 and 2, an optical inspection apparatus 1 according to an embodiment may include a stage 100, a power application unit 400, an optical unit 200, 250, and 300, and a controller 500.

The stage 100 may provide a space for placing a target substrate SUB. The target substrate SUB may be placed on the stage 100 during an inspection process for inspecting optical characteristics of a plurality of light emitting elements included in the target substrate SUB to be described later.

The power application unit 400 may apply a test power to the target substrate SUB and fix the target substrate SUB. The power application unit 400 may include a jig unit 410 for fixation of the target substrate SUB placed on the stage 100 and transfer of an electrical signal and a power supply unit 420 for supply of power to the jig unit 410.

The jig unit 410 may be electrically connected to pads of the target substrate SUB and transfer an electrical signal received from the power supply unit 420 to the target substrate SUB. The jig unit 410 may include an opening OP penetrating therethrough. The jig unit 410 may be aligned on the target substrate SUB to expose an area, in which the plurality of light emitting elements of the target substrate SUB may be disposed, through the opening OP.

The optical unit 200, 250, and 300 may be arranged or disposed above the stage 100 to magnify a surface of the target substrate SUB, acquire an image by detecting light emitted from the plurality of light emitting elements included in the target substrate SUB, and measure optical characteristics of light sources or determine whether each of the light emitting elements emits light based on the image.

The optical unit 200, 250, and 300 may include a microscope 200, a camera unit 250, and an optical measurement unit 300.

The microscope 200 may be arranged or disposed above the stage 100. The microscope 200 may serve to magnify the surface of the target substrate SUB placed on the stage 100 and provide magnified image data of the target substrate SUB to the camera unit 250 and the optical measurement unit 300.

The microscope 200 may include a body tube 210, a plurality of lenses 220, and a revolver 230. The microscope 200 may include a lighting unit 240. The aforementioned components may be installed inside the body tube 210.

The plurality of lenses 220 may include lenses 220 having various magnifications. For example, the lenses 220 may have magnifications of 2.5×, 5×, 10×, 20×, 50×, and the like within the spirit and the scope of the disclosure. The lenses 220 having various magnifications may be adjusted, by using the rotatable revolver 230, to magnify the surface of the target substrate SUB according to the inspection target (for example, a light emitting element or a pixel) or the inspection region to be inspected on the target substrate SUB.

The lighting unit 240 may serve to adjust the brightness of the image data by irradiating light in the case where the image data of the target substrate SUB measured and magnified with the high magnification lens 220 is dark.

First and second light path adjusting units MR1 and MR2 may be arranged or disposed inside the body tube 210. The first and second light path adjusting units MR1 and MR2 may serve to adjust the light path to guide the light emitted from the target substrate SUB to the camera unit 250 and/or the optical measurement unit 300. For example, the first and second light path adjusting units MR1 and MR2 may each be made up of a mirror, a beam splitter, or a semitransparent glass, but the disclosure is not limited thereto. The first and second light path adjusting units MR1 and MR2 may be designed in various manners as long as they may adjust the light path to guide the light emitted from the target substrate SUB and transmitted through the lens 220 to the camera unit 250 and/or the optical measurement unit 300.

The camera unit 250 may generate a two-dimensional (2D) image of the target substrate SUB based on the image data of the target substrate SUB magnified by the microscope 200. The 2D image of the target substrate SUB that has been generated by the camera unit 250 may be transferred to the controller 500.

In detail, the camera unit 250 may be disposed on the body tube 210, and capture image data of the surface of the target substrate SUB magnified by the microscope 200 to generate the 2D image of the target substrate SUB. The 2D image of the target substrate SUB may be a 2D image of a partial area of the target substrate SUB that has been magnified by the microscope 200 rather than the whole area of the target substrate SUB. For example, the 2D image generated by the camera unit 250 may be a light emission image in which the plurality of light emitting elements arranged or disposed in a partial area of the target substrate SUB may emit light. For example, the camera unit 250 may include a charge coupled device (CCD) camera. The camera unit 250 may receive lights having various wavelengths, and the light emission image generated by the camera unit 250 may be a color image. It may be possible to identify the presence/absence of light emission, relative light emission intensity, or light color of a light emitting element with naked eyes in the color light emission image generated by the camera unit 250.

The optical measurement unit 300 may generate a spectrum image of the target substrate SUB based on the image data of the target substrate SUB magnified by the microscope 200, and measure the optical characteristics of the image data of the target substrate SUB based on the spectrum image.

In detail, the optical measurement unit 300 may be arranged or disposed above the body tube 210 to capture image data of the surface of the target substrate SUB magnified by the microscope 200 and generate a spectrum image of the target substrate SUB. The spectrum image of the target substrate SUB may be a spectrum image of a partial area of the target substrate SUB magnified by the microscope 200 rather than the whole area of the target substrate SUB. In an embodiment, the optical measurement unit 300 may be a 2D spectroscope.

The spectrum image generated by the 2D spectroscope may include a plurality of pixels. A pixel of the spectrum image generated by the 2D spectroscope may be the smallest unit whose optical characteristics may be measured by the 2D spectroscope. For example, the 2D spectroscope may measure a per-pixel optical characteristic value by a pixel included in the spectrum image, rather than a per-area optical characteristic value by a whole area of the spectrum image generated by the 2D spectroscope. In an embodiment, each pixel of the spectrum image may be smaller in size than the image data corresponding to a light emitting element in the image data magnified by the microscope 200. Because the size of each pixel of the spectrum image generated by the 2D spectroscope is smaller than the size of an image corresponding to the light emitting element, it may be possible to measure per-location optical characteristic values of the light emitting element. A detailed description thereof will be given later with reference to FIGS. 13A to 15.

The controller 500 may receive a magnified color light emission image of the target substrate SUB generated from the camera unit 250. The color light emission image received from the camera unit 250 may include a plurality of pixels, and the controller 500 may measure a unique color value of each pixel of the color light emission image and measure data. For example, the unique color value of each pixel of the color light emission image that has been measured by the controller 500 may be color coordinate values corresponding to the pixel.

For example, the controller 500 may receive the spectrum image of the target substrate SUB that has been generated by the optical measurement unit 300 and the optical characteristic data of the target substrate SUB that have been measured by the optical measurement unit 300. The controller 500 may store and analyze the light emission image and the optical characteristic data of the target substrate SUB.

The target substrate SUB may be a light emitting element sample or a display device on which a plurality of light emitting elements may be arranged or disposed. In an embodiment, the plurality of light emitting elements arranged or disposed on the target substrate SUB may have various sizes. For example, the target substrate SUB may be a light emitting element sample on which a plurality of inorganic light emitting elements may be arranged or disposed. The inorganic light emitting elements may each be a nano inorganic light emitting diode or a micro inorganic light emitting diode. However, the disclosure is not limited thereto, and examples of the light emitting element may include a micro LED chip and an organic light emitting element.

In an embodiment, although the plurality of light emitting elements arranged or disposed on the target substrate SUB may have a micro or nano size, it may be possible to measure the optical characteristics of the light emitting element small in size because the smallest measurement unit of the 2D spectroscope of the optical measurement unit 300 capturing the image data magnified by the microscope 200 is smaller than the size of the light emitting element included in the magnified image data.

Figure 3:
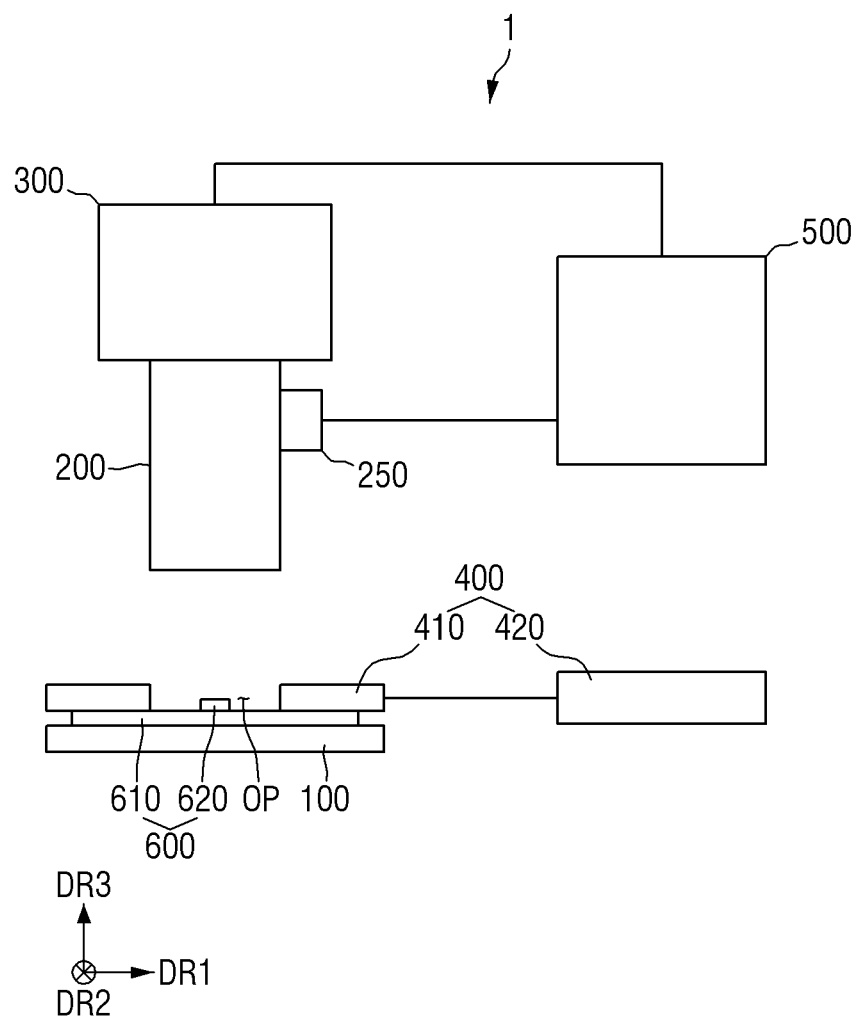
FIG. 3 is a schematic view illustrating an optical inspection apparatus equipped with a correction light source.

FIG. 3 is a schematic view illustrating an optical inspection apparatus equipped with a correction light source.

Referring to FIG. 3, the optical inspection apparatus 1 may include a correction unit 600. The correction unit 600 may include a base substrate 610 and a correction light source 620 arranged or disposed on the base substrate 610.

The correction unit 600 may inspect whether there is noise in the optical characteristic value measured by the optical inspection apparatus 1 and, if there is noise, reflect a correction value to cancel the noise, which may lead to improvement of inspection reliability of the optical inspection apparatus 1.

The correction light source 620 may be a light source that emits light having a wavelength within a narrow band. For example, the correction light source 620 may include an LED emitting light of a certain or predetermined wavelength band. For example, the correction light source 620 may emit light in one of a blue wavelength band, a red wavelength band, and a green wavelength band. The wavelength band of the light emitted by the correction light source 620 may be provided in advance.

In detail, the wavelength band of the light emitted by the correction light source 620 may be similar to the wavelength band of the light emitted by the plurality of light emitting elements included in the target substrate SUB to be measured. For example, in order to inspect the optical characteristics of the target substrate SUB including the plurality of light emitting elements emitting blue light, it may be necessary to measure the spectrum characteristic of the correction light source 620 emitting the blue light with the optical measurement unit 300 of the optical inspection apparatus 1 before starting the inspection process. The controller 500 of the optical inspection apparatus 1 may compare the wavelength band of the light of the correction light source 620 that has been measured by the optical measurement unit 300 with the pre-provided wavelength band of the light being emitted by the correction light source 620 to determine the presence or absence of noise occurrence. If noise has occurred, the controller 500 may reflect a correction value for canceling the noise and perform inspection on the target substrate SUB.

Figure 4:
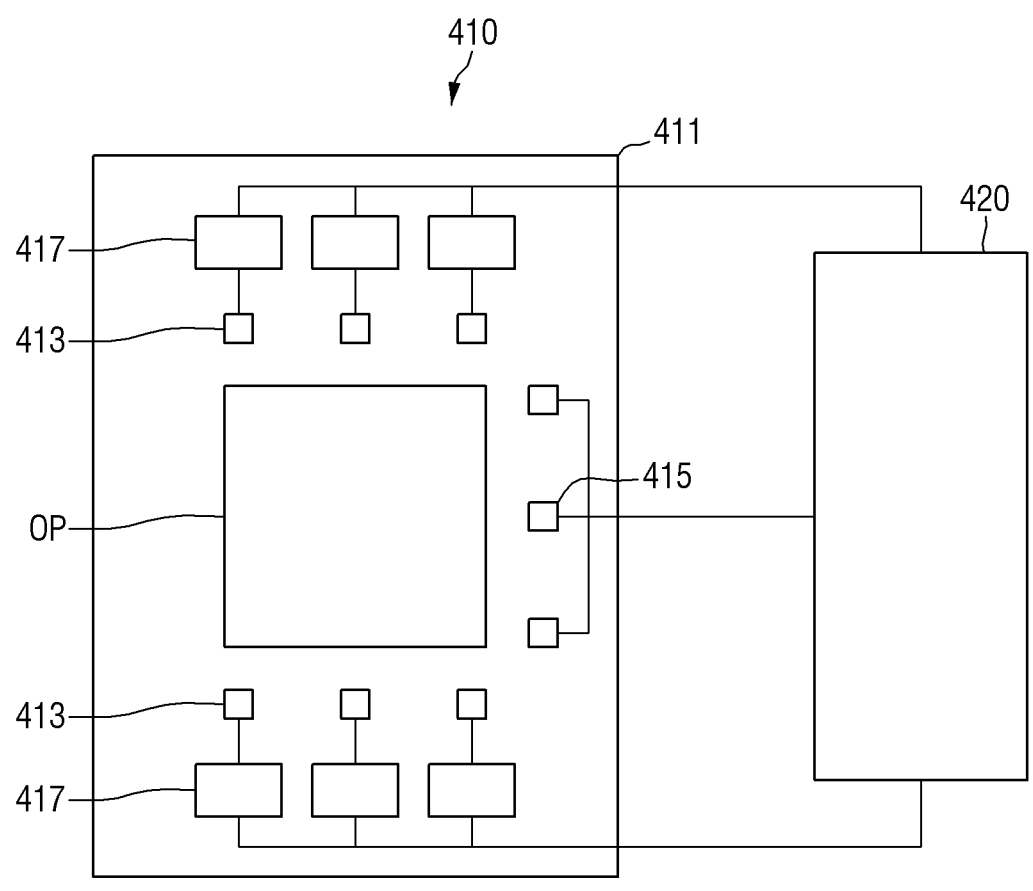
FIG. 4 is a bottom view of a power application unit according to an embodiment.
Figure 4:
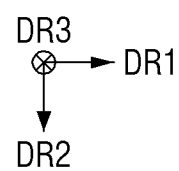
Figure 5:
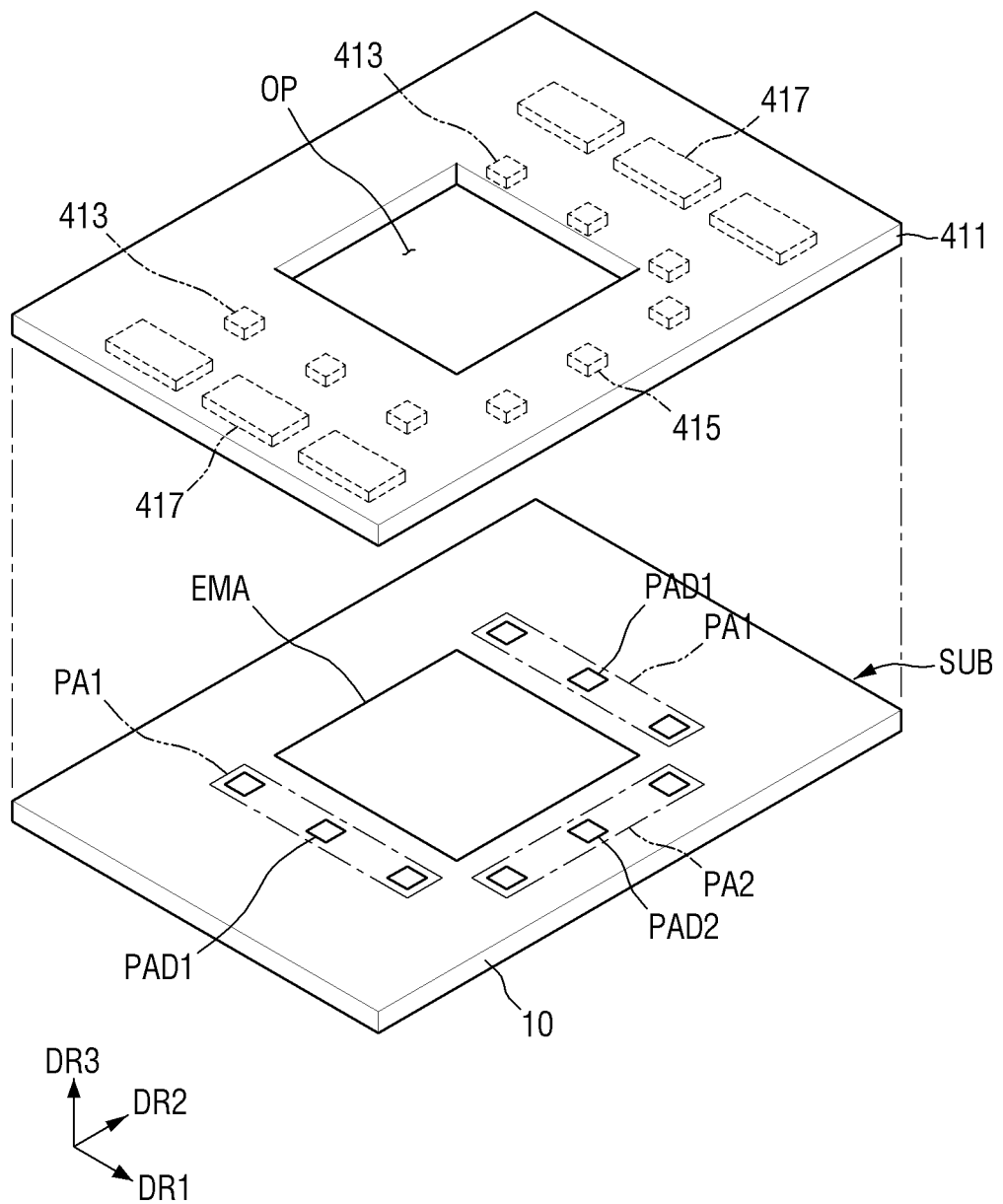
FIG. 5 is a layout view illustrating relative arrangements of a target substrate and a jig unit according to an embodiment.
Figure 6:
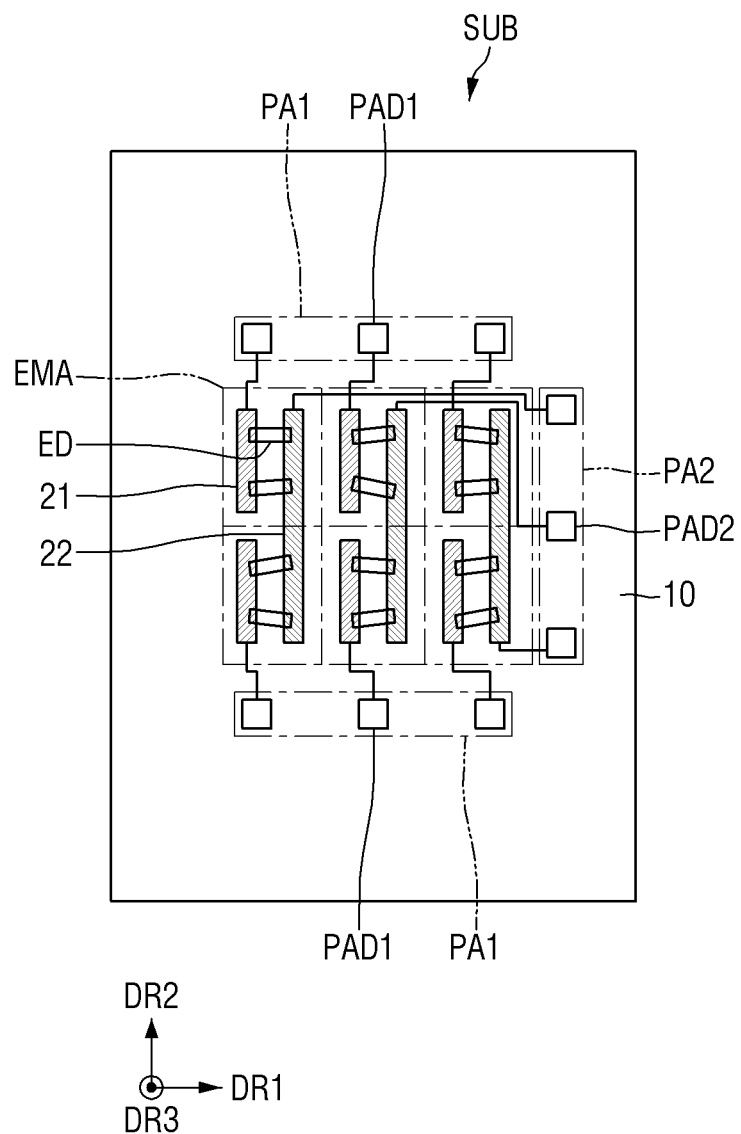
FIG. 6 is a plan view of a target substrate according to an embodiment.

FIG. 4 is a bottom view of a power application unit according to an embodiment. FIG. 5 is a layout view illustrating relative arrangements of a target substrate and a jig unit according to an embodiment. FIG. 6 is a plan view of a target substrate according to an embodiment.

Referring to FIGS. 4 and 5, the jig unit 410 may include a base member 411, and a plurality of first connectors 413, a plurality of second connectors 415, and a conductive pattern 417 that may be arranged or disposed on the bottom surface of the base member 411.

The base member 411 may be provided with an opening OP penetrating therethrough. The base member 411 may be arranged or disposed to overlap an emission area EMA of the target substrate SUB. In detail, the base member 411 may be arranged or disposed such that the opening OP may overlap the emission area EMA of the target substrate SUB and the remaining area other than the opening OP may overlap a non-emission area (not shown) of the target substrate SUB.

The plurality of first connectors 413 and the plurality of second connectors 415 may each be supplied with power from the power supply unit 420. The first and second connectors 413 and 415 may be electrically connected to first pads PAD1 and second pads PAD2 of the target substrate SUB, respectively, so as to apply an electrical signal received from the power supply unit 420 to the target substrate SUB. The jig unit 410 may be disposed on the target substrate SUB such that the first and second connectors 413 and 415 of the jig unit 410 may respectively electrically contact the corresponding first and second pads PAD1 and PAD2 of the target substrate SUB.

Although it is shown in the drawing that the first connectors 413 may be arranged or disposed on the bottom surface of the base member 411 on one or a side and the other or another side of the opening OP in a second direction DR2, and the second connectors 415 may be arranged or disposed on the bottom surface of the base member 411 on one or a side of the opening OP in a first direction DR1, the first and second connectors 413 and 415 are not limited in arrangement thereto. The first and second connectors 413 and 415 are not particularly limited in arrangement as long as they are capable of being electrically connected to the first and second pads PAD1 and PAD2 arranged or disposed on the substrate SUB to apply an electrical signal.

The first connectors 413 may each be connected to the conductive pattern 417. The conductive pattern 417 may have a predetermined resistance value. The conductive pattern 417 may be a regulation resistor element that may be electrically connected to the first connectors 413 to supply a uniform current to a plurality of light emission groups EDGn (see FIG. 7). A detailed description thereof is made later with reference to another drawing or other drawings.

Referring to FIGS. 5 and 6, the target substrate SUB may include a first substrate 10, a plurality of first electrodes 21, a plurality of second electrodes 22, a plurality of light emitting elements ED arranged or disposed between the first and second electrodes 21 and 22, first pads PAD1, and second pads PAD2.

The first substrate 10 may include an emission area EMA, a first pad area PA1, and a second pad area PA2. The emission area EMA may be an area composed of a plurality of light emitting elements ED arranged or disposed therein as a measurement target of which optical characteristics are measured by the optical inspection apparatus 1.

The first and second electrodes 21 and 22 may be arranged or disposed on the first substrate 10. The first and second electrodes 21 and 22 may be arranged or disposed in the emission area EMA on the first substrate 10. The first and second electrodes 21 and 22 may extend along the second direction DR2 in the emission area EMA. The first and second electrodes 21 and 22 may be arranged or disposed to extend in the second direction DR2 and may be spaced apart from each other in the first direction DR1.

Each of the first and second electrodes 21 and 22 may include a transparent conductive material. For example, each of the first and second electrodes 21 and 22 may include a material such as indium tin oxide (ITO), indium zinc oxide (IZO), and indium tin zinc oxide (ITZO), but is not limited thereto. In an embodiment, each of the first and second electrodes 21 and 22 may include a conductive material having high reflectivity. For example, each of the first and second electrodes 21 and 22 may include, as a material having high reflectivity, a metal such as silver (Ag), copper (Cu), or aluminum (Al).

The plurality of light emitting elements ED may be arranged or disposed between the first and second electrodes 21 and 22. The light emitting elements ED may each have a shape extending in one or a direction. The plurality of light emitting elements ED may be spaced apart from one another along the second direction DR2 in which the first and second electrodes 21 and 22 extend in a plan view. The extending direction of the light emitting elements ED may be substantially perpendicular to the extending direction of the first and second electrodes 21 and 22. However, the disclosure is not limited thereto, and the light emitting elements ED may each be arranged or disposed to extend in a direction oblique rather than perpendicular to the extending direction of the first and second electrodes 21 and 22.

The first and second electrodes 21 and 22 may be electrically connected to the light emitting elements ED to apply a predetermined voltage to the light emitting elements ED for light emission.

The light emitting elements ED may emit light of a specific or predetermined wavelength band to the outside. The target substrate SUB may include different kinds of light emitting elements ED emitting lights of different wavelength bands, or may include light emitting elements ED emitting lights of the same wavelength band.

The light emitting elements ED may be dot light sources. In an embodiment, the light emitting elements ED may be light emitting diodes. In detail, the light emitting elements ED may be inorganic light emitting diodes each having a micro-meter or nano-meter size and made of an inorganic material. However, the disclosure is not limited thereto, and the light emitting elements ED may be micro-light emitting diode (LED) chips or organic light emitting diodes. Hereinafter, the description is directed to the case where the light emitting elements ED are inorganic light emitting diodes each having a micro-meter or nano-meter size and made of an inorganic material.

The first and second pads PAD1 and PAD2 may be arranged or disposed in the first and second pad areas PA1 and PA2, respectively. The plurality of first pads PAD1 may be electrically connected to the respective first electrodes 21.

The plurality of second pads PAD2 may be electrically connected to the respective second electrodes 22.

The plurality of light emitting elements ED may be electrically connected to the first and second electrodes 21 and 22, and receive electrical signals respectively applied to the first and second electrodes 21 and 22 from the first and second pads PAD1 and PAD2 through the first and second electrodes 21 and 22.

The inspection process on the target substrate SUB may start with aligning the jig unit 410 on the target substrate SUB such that the opening OP of the jig unit 410 corresponds to the emission area EMA of the target substrate SUB, and the first and second connectors 413 and 415 of the jig unit 410 correspond to the respective first and second pads PAD1 and PAD2 of the target substrate SUB. If the jig unit 410 is aligned on the target substrate SUB such that the first and second connectors 413 and 415 are electrically connected to the first and second pads PAD1 and PAD2, the plurality of light emitting elements ED may be applied with an electrical signal from the power supply unit 420 through the first and second connectors 413 and 415, the first and second pads PAD1 and PAD2, and the first and second electrodes 21 and 22. The light emitting elements ED applied with the electrical signal from the power supply unit 420 may emit light.

Figure 7:
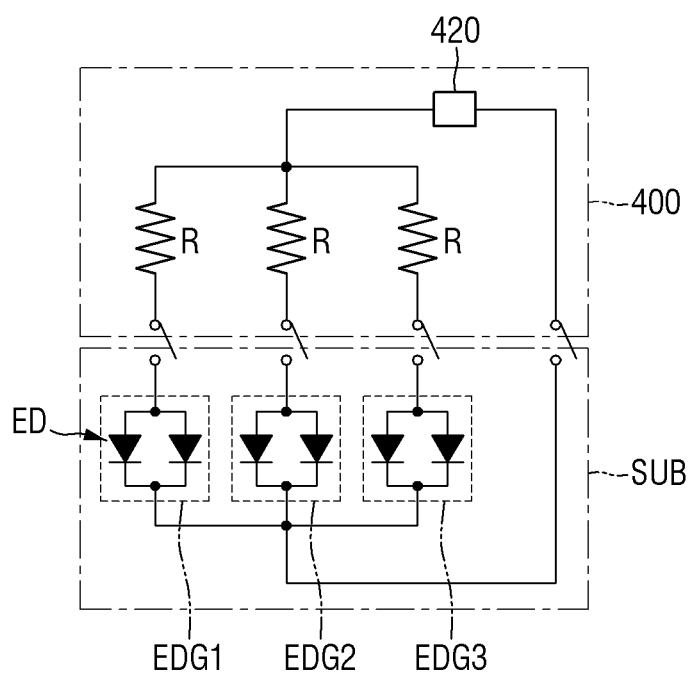
FIG. 7 is an equivalent circuit diagram illustrating a case in which a plurality of pads of a target substrate and a plurality of connectors of a jig unit are not electrically connected.
Figure 8:
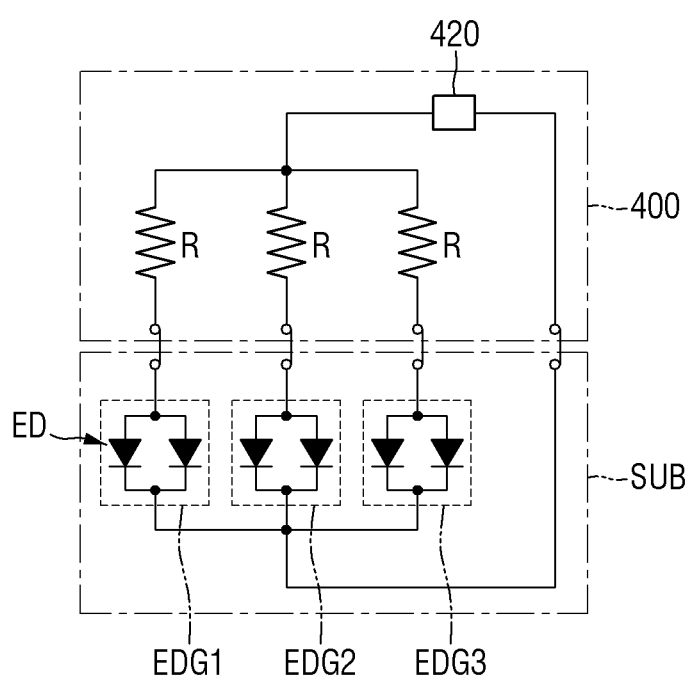
FIG. 8 is an equivalent circuit diagram illustrating a case in which a plurality of pads of a target substrate and a plurality of connectors of a jig unit are electrically connected.

FIG. 7 is an equivalent circuit diagram illustrating a case in which a plurality of pads of a target substrate and a plurality of connectors of a jig unit are not electrically connected. FIG. 8 is an equivalent circuit diagram illustrating a case in which a plurality of pads of a target substrate and a plurality of connectors of a jig unit are electrically connected.

Referring to FIGS. 5 to 8, a plurality of light emission groups EDGn may include first to nth light emission groups (n is a natural number equal to or greater than 2). Although it is exemplarily shown that the plurality of light emission groups EDGn include first to third light emission groups EDG1, EDG2, and EDG3, each including two light emitting elements ED, the number of light emitting elements ED of each of the light emission groups EDG1, EDG2, and EDG3 is not limited thereto.

The light emitting elements ED constituting each light emission group EDG (EDG1, EDG2, EDG3) may be connected in parallel to each other. On the target substrate SUB, the light emitting elements ED may each be electrically connected at one or an end thereof to the first pad PAD1 and at the other or another end thereof to the second pad PAD2.

In the case where the plurality of pads PAD1 and PAD2 of the target substrate SUB and the plurality of connectors 413 and 415 of the jig unit 410 are not electrically connected, a switch disposed between one or an end of each light emission group EDG (EDG1, EDG2, EDG3) and a regulation resistor element R may be turned off as shown in FIG. 7 such that each light emission group EDG (EDG1, EDG2, EDG3) may not be electrically connected to the corresponding regulation resistor element R. For example, a switch arranged or disposed between the other ends of the light emission groups EDG (EDG1, EDG2, EDG3) and the power supply unit 420 may be turned off such that each light emission group EDG (EDG1, EDG2, EDG3) may not be electrically connected to the power supply unit 420.

In the case where the plurality of pads PAD1 and PAD2 of the target substrate SUB and the plurality of connectors 413 and 415 of the jig unit 410 are electrically connected, a switch disposed between one or an end of each light emission group EDG (EDG1, EDG2, EDG3) and the regulation resistor element R may be turned on as shown in FIG. 8 such that each light emission group EDG (EDG1, EDG2, EDG3) may be electrically connected in series to the corresponding regulation resistor element R. One or an end of each light emission group EDG (EDG1, EDG2, EDG3) may be electrically connected to the power supply unit 420 via the regulation resistor element R. For example, the switch disposed between the other ends of the light emission groups EDG (EDG1, EDG2, EDG3) and the power supply unit 420 may be turned on such that each light emission group EDG (EDG1, EDG2, EDG3) may be electrically connected to the power supply unit 420. The one and the other ends of the light emission group EDG (EDG1, EDG2, EDG3) may be electrically connected to the power supply unit 420 such that the light emitting elements constituting the light emission group EDG (EDG1, EDG2, EDG3) may emit light.

The regulation resistor element R may correspond to the conductive pattern 417 having a predetermined resistance value. The regulation resistor element R may serve to supply a uniform current to each light emission group EDG (EDG1, EDG2, EDG3). The regulation resistor element R may have a resistance value greater than that of the light emitting element ED. The resistance value of the regulation resistor element R may be in the range of about 1 MΩ to about 20 MΩ. For example, the resistance value of the regulation resistor element R may be equal to or about 5 times the resistance value of the light emitting element ED, but the disclosure is not limited thereto, and a ratio of the resistance value of the regulation resistor element R to the resistance value of the light emitting element ED is not limited thereto. As the plurality of light emission groups may be electrically connected in series to the regulation resistor elements R having a resistance value greater than that of the light emitting element ED, it may be possible to supply a uniform current to the light emission groups even though at least one of the light emitting elements constituting the plurality of light emission groups EDG (EDG1, EDG2, EDG3) may be defective. Although it is exemplarily shown in the drawings that the conductive pattern 417 electrically connected to the light emission groups EDG (EDG1, EDG2, EDG3) for supply of a uniform current to the light emission groups EDG (EDG1, EDG2, EDG3) is composed of resistor elements, the disclosure is not limited thereto. For example, the conductive pattern 417 may be composed of capacitor elements for supplying a uniform current to the light emission groups EDG (EDG1, EDG2, EDG3).

Figure 9:
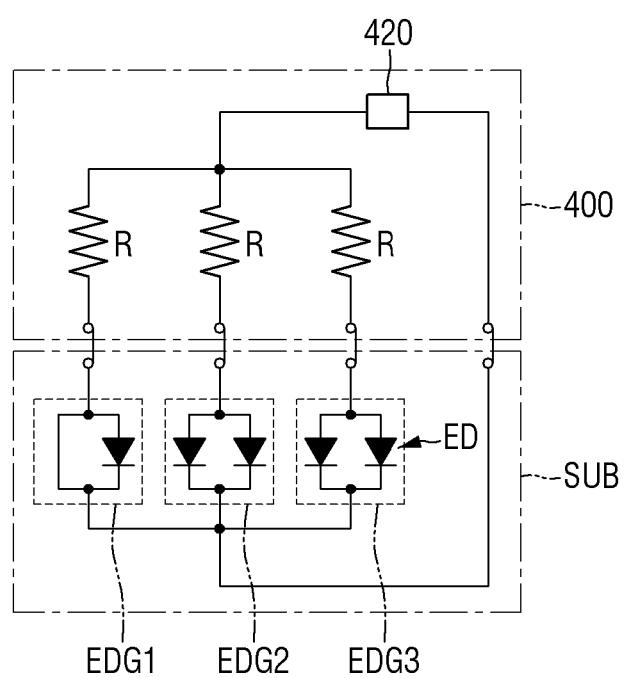
FIG. 9 is an equivalent circuit diagram illustrating a case where a light emitting element included in a target substrate is defective.

FIG. 9 is an equivalent circuit diagram illustrating a case where a light emitting element included in a target substrate is defective.

The equivalent circuit diagram of FIG. 9 shows an example in which one of the light emitting elements ED constituting the first light emission group EDG1 is defective. The defective light emitting element ED of the first light emission group EDG1 may be electrically shorted due to an occurrence of a defect. Because one or an end of each of the light emission groups EDG1, EDG2, and EDG3 may be electrically connected in series to the regulation resistor element R having a resistance value greater than that of the light emitting element ED, even though the light emitting element ED in the first light emission group EDG1 may be defective, the current flowing through the first to third light emission groups EDG1, EDG2, and EDG3 may be uniformly distributed. Meanwhile, if there is no regulation resistor element R in the circuit, the current may flow through only the defective light emitting element ED having the resistance value of about 0 and may not flow through the second and third light emission groups EDG2 and EDG3. In this case, because no current flows through the second and third light emission groups EDG2 and EDG3 in which no defect has occurred, the light emitting elements ED constituting the second and third light emission groups EDG2 and EDG3 may not emit light. Thus, optical characteristic measurement may fail to be performed even on the non-defective light emitting elements.

Meanwhile, the jig unit 410 of the optical inspection apparatus 1 according to an embodiment may include the conductive pattern 417 corresponding to the regulation resistor elements R, which may allow a uniform current to flow through the respective light emission groups EDG (EDG1, EDG2, EDG3). In detail, each of the light emission groups EDG (EDG1, EDG2, EDG3) may be electrically connected in series to the corresponding regulation resistor element R having a high resistance value, which may make it possible to reduce a difference between total resistance values of the light emission groups EDG (EDG1, EDG2, EDG3) even in a case that the light emitting element ED included in at least one of the light emission groups EDG (EDG1, EDG2, EDG3) may be defective. This means that the current flows even in the light emission group EDG (EDG1, EDG2, EDG3) in which no defect has occurred so as to make it possible to perform optical characteristic measurement on the light emitting elements ED constituting the light emission group EDG (EDG1, EDG2, EDG3). As described above, even in a case that the jig unit 410 may include the conductive pattern 417 corresponding to capacitor elements, the capacitor elements may be electrically connected in series to the respective light emission groups EDG1, EDG2, and EDG3. Even in a case that at least one of the plurality of light emission groups EDG1, EDG2, and EDG3 may include the defective light emitting element ED, since the capacitor elements may be electrically connected in series to the respective light emission groups EDG1, EDG2, and EDG3, it may be possible to supply a uniform current to the light emission groups EDG1, EDG2, and EDG3.

Figure 10:
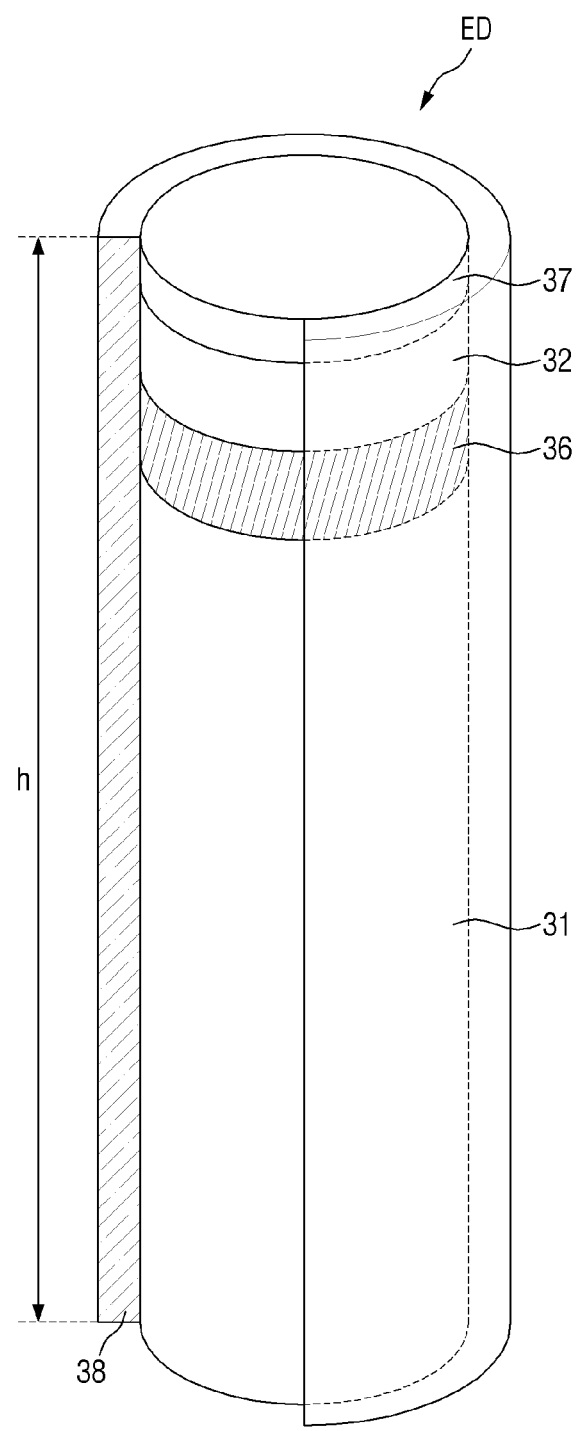
FIG. 10 is a perspective view of a light emitting element according to an embodiment.

FIG. 10 is a perspective view of a light emitting element according to an embodiment.

Referring to FIG. 10, the light emitting element ED according to an embodiment may have a shape extending in one or a direction. The light emitting element ED may have a shape substantially that of a rod, wire, tube, or the like within the spirit and the scope of the disclosure. In an embodiment, the light emitting element ED may have a substantially cylindrical or rod shape. However, the light emitting element ED is not limited in shape thereto and may have a shape substantially that of a cube, a rectangular parallelepiped, and a polygonal cylinder such as a hexagonal cylinder.

The light emitting element ED may include a semiconductor layer doped with any conductivity type (for example, p-type or n-type) impurities. The semiconductor layer may emit light of a specific or predetermined wavelength band by receiving an electrical signal applied from an external power source.

The light emitting element ED may include a first semiconductor layer 31, a second semiconductor layer 32, an active layer 36, an element electrode layer 37 and an insulating layer 38.

The first semiconductor layer 31 may be an n-type semiconductor. For example, in a case that the light emitting element ED emits light of a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of n-type doped AlGaInN, GaN, AlGaN, InGaN, AlN and InN.

The second semiconductor layer 32 may be spaced apart from the first semiconductor layer 31 along the extending direction of the light emitting element ED. The second semiconductor layer 32 may be a p-type semiconductor. For example, in a case that the light emitting element ED emits light of a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of p-type doped AlGaInN, GaN, AlGaN, InGaN, AlN and InN.

The active layer 36 may be disposed between the first semiconductor layer 31 and the second semiconductor layer 32. The active layer 36 may include a material having a single or multiple quantum well structure. In a case that the active layer 36 may include a material having a multiple quantum well structure, a plurality of quantum layers and well layers may be stacked alternately. The active layer 36 may emit light by coupling of electron-hole pairs according to an electrical signal applied through the first semiconductor layer 31 and the second semiconductor layer 32. For example, in a case that the active layer 36 emits light of a blue wavelength band, a material such as AlGaN or AlGaInN may be included. In an embodiment, as described above, the active layer 36 may include AlGaInN as a quantum layer and AlInN as a well layer, and the active layer 36 may emit blue light having a central wavelength band in a range of about 450 nm to about 495 nm. The light emitted by the active layer 36 is not limited to light of a blue wavelength band, rather the active layer 36 may also emit light of a red or green wavelength band in some cases. The length of the active layer 36 in the one or a direction may have a range of about 0.05 μm to about 0.10 μm, but is not limited thereto.

The element electrode layer 37 may be disposed on the second semiconductor layer 32. The element electrode layer 37 may be an ohmic contact electrode. However, without being limited thereto, it may be a Schottky contact electrode. The element electrode layer 37 may include a conductive metal. For example, the element electrode layer 37 may include at least one of aluminum (Al), titanium (Ti), indium (In), gold (Au), silver (Ag), indium tin oxide (ITO), indium zinc oxide (IZO), or indium tin zinc oxide (ITZO).

The insulating layer 38 may be arranged or disposed to surround the side surfaces of the plurality of semiconductor layers 31 and 32 and the element electrode layer 37. In an embodiment, the insulating layer 38 may be arranged or disposed to surround at least the or a side surface of the active layer 36 and extend along the extending direction of the light emitting element ED. The insulating layer 38 may serve to protect the first and second semiconductor layers 31 and 32, the active layer 36, and the element electrode layer 37. For example, the insulating layer 38 may be formed or disposed to surround the side surfaces of the first and second semiconductor layers 31 and 32, the active layer 36, and the element electrode layer 37 and expose both ends of the light emitting element ED in the length direction thereof.

The insulating layer 38 may include materials having insulating properties, for example, silicon oxide ($SiO_x$), silicon nitride ($SiN_x$), silicon oxynitride ($SiO_xN_y$), aluminum nitride (AlN), aluminum oxide ($AlO_x$), and the like within the spirit and the scope of the disclosure. Accordingly, it may be possible to prevent an electrical short circuit that may occur in a case that the active layer 36 may be in direct contact with the electrode through which the electrical signal may be transmitted to the light emitting element ED.

The light emitting element ED may have a length h in a range of about 1 μm to about 10 μm or in a range of about 2 μm to about 6 and for example, in a range of about 3 μm to about 5 For example, the light emitting element ED may have a diameter in a range of about 30 nm to about 700 nm, and an aspect ratio of the light emitting element ED may be in a range of about 1.2 to about 100. However, the disclosure is not limited thereto, and the plurality of light emitting elements ED may have different diameters according to a difference in composition of the active layer 36. By way of example, the diameter of the light emitting element ED may be about 500 nm.

Hereinafter, a description is made of an inspection method using the above-described optical inspection apparatus 1.

Figure 11:
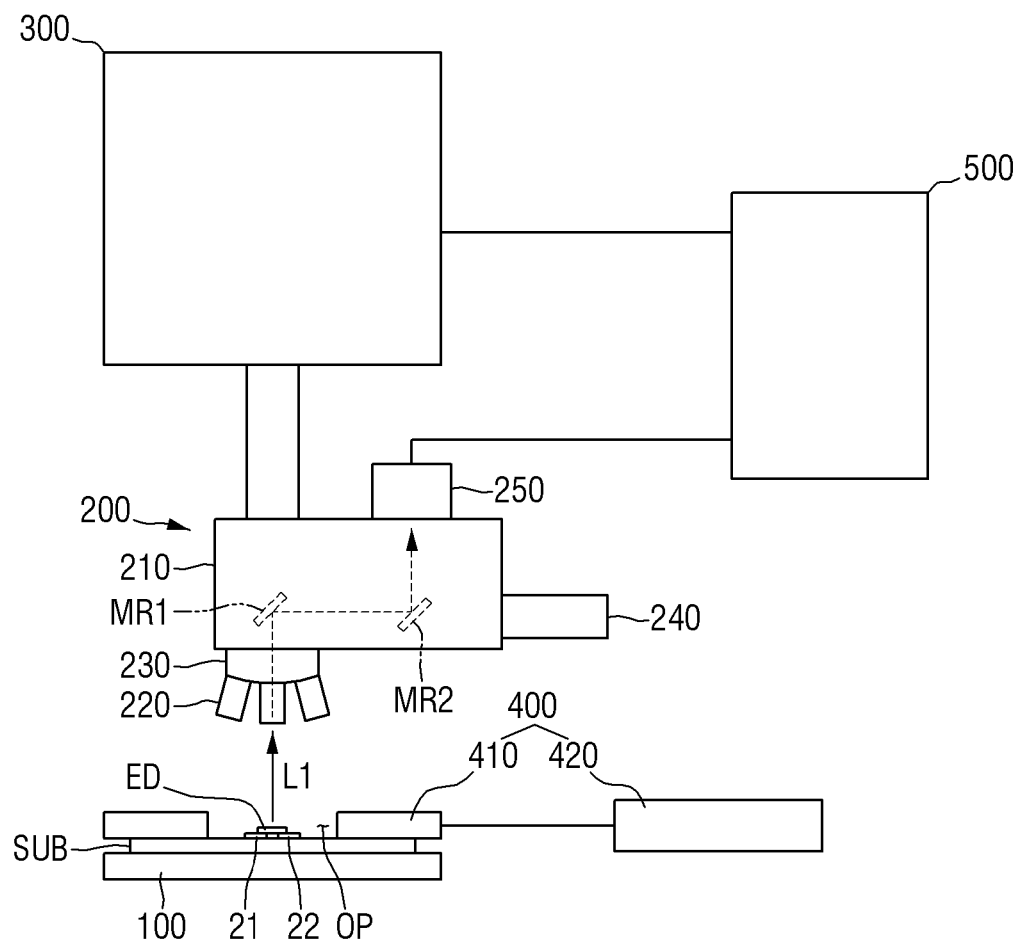
FIGS. 11 and 12 are schematic views for explaining an operation method of the optical inspection apparatus according to an embodiment.
Figure 12:
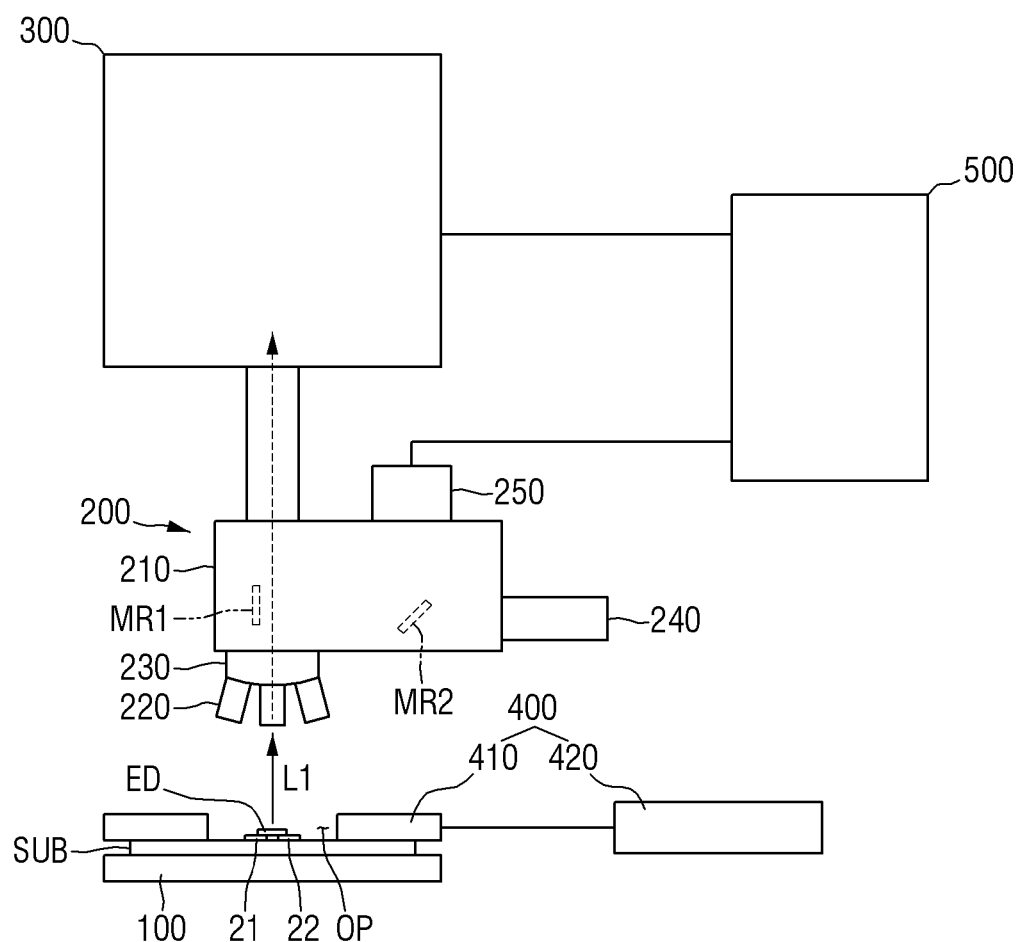

FIGS. 11 and 12 are schematic views for explaining an operation method of the optical inspection apparatus according to an embodiment.

First, the target substrate SUB may be placed on the stage 100.

Next, the jig unit 410 may be aligned on the target substrate SUB such that the plurality of pads PAD formed or disposed on the top surface of the target substrate SUB placed on the stage 100 may be in contact with the connectors 413 and 415 formed or disposed on the bottom surface of the jig unit 410. As described above, the opening OP of the jig unit 410 may overlap the emission area EMA in a third direction DR3, the emission area EMA being composed of the plurality of light emitting elements ED disposed on the target substrate SUB to emit light. The light emitting elements ED may be exposed through the opening OP in the third direction DR3.

Next, the power supply unit 420 may supply a test power to the jig unit 410. Upon receipt of the test power from the power supply unit 420, the jig unit 410 may transfer an electrical signal to the first and second electrodes 21 and 22 of the target substrate SUB via the pads PAD. The light emitting elements ED included in the target substrate SUB may emit light according to the electrical signal.

Next, among the plurality of lenses 220, the lens 220 having a magnification for use in inspecting the target substrate SUB may be adjusted, to face the target substrate SUB. In detail, the lens 220 having a magnification for use in inspection may be selected from among the plurality of lenses 220, and the selected lens 220 may be moved by means of the revolver 230 to face the inspection area of the target substrate SUB.

In order for the optical measurement unit 300 to measure per-location luminance distribution of the light emitting elements ED, the length of each of the light emitting elements ED, in the extending direction, included in the image data of the target substrate SUB magnified by the lens 220 may be greater than the size of one pixel of the spectrum image. Accordingly, it may be necessary to select the lens 220 that allows the length of each of the light emitting elements ED, in the extending direction, included in the image data magnified by the lens 220 to be greater than the size of one pixel of the spectrum image.

Next, referring to FIG. 11, the camera unit 250 may capture image data of the target substrate SUB magnified by the lens 220 to generate a color light emission image of the target substrate SUB. The light emitted L1 from the target substrate SUB and transmitted through the lens 220 may be reflected from one surface of the first light path adjusting unit MR1 to reach the second light path adjusting unit MR2, and may be reflected from one surface of the second light path adjusting unit MR2 to enter the camera unit 250. The camera unit 250 may generate a color light emission image of the target substrate SUB and send the color light emission image to the controller 500. The controller 500 may measure a unique color value of each pixel of the color light emission image. As described above, the unique color value may be color coordinate values corresponding to the pixel. For example, by observing the color light emission image, it may be possible to identify the light emission state and the emitted color of the light emitting elements ED in real time.

Next, referring to FIG. 12, the optical measurement unit 300 may capture image data of the target substrate SUB magnified by the lens 220 to generate a spectrum image of the target substrate SUB. Although not shown in the drawing, in order for the optical inspection apparatus 1 to generate a spectrum image of the target substrate SUB, the controller 500 may control the first light path adjusting unit MR1 such that the light emitted from the target substrate SUB and transmitted through the lens 220 proceeds to enter the optical measurement unit 300. Accordingly, the light emitted from the target substrate SUB may enter the optical measurement unit 300. The optical measurement unit 300 may generate the spectrum image of the target substrate SUB and send optical characteristic data measured based on the spectrum image to the controller 500.

The controller 500 may compare per-pixel wavelength data measured from the spectrum image with the per-pixel unique color value of the color light emission image, for example, color coordinates of the data measured by the optical measurement unit 300, to determine whether there is any noise caused by the optical measurement unit 300.

If it is determined that the color indicated by the per-pixel wavelength data measured from the spectrum image is different from the color corresponding to the per-pixel unique color value of the color light emission image, the controller 500 may determine that there is noise caused by the optical measurement unit 300. In this case, the controller 500 may reflect a correction value for removing the noise and perform inspection again.

If it is determined that the color indicated by the per-pixel wavelength data measured from the spectrum image is identical with the color corresponding to the per-pixel unique color value of the color light emission image, the controller 500 may analyze the data measured based on the spectrum image to measure the optical characteristics of the light emitting elements ED.

Figure 13A:
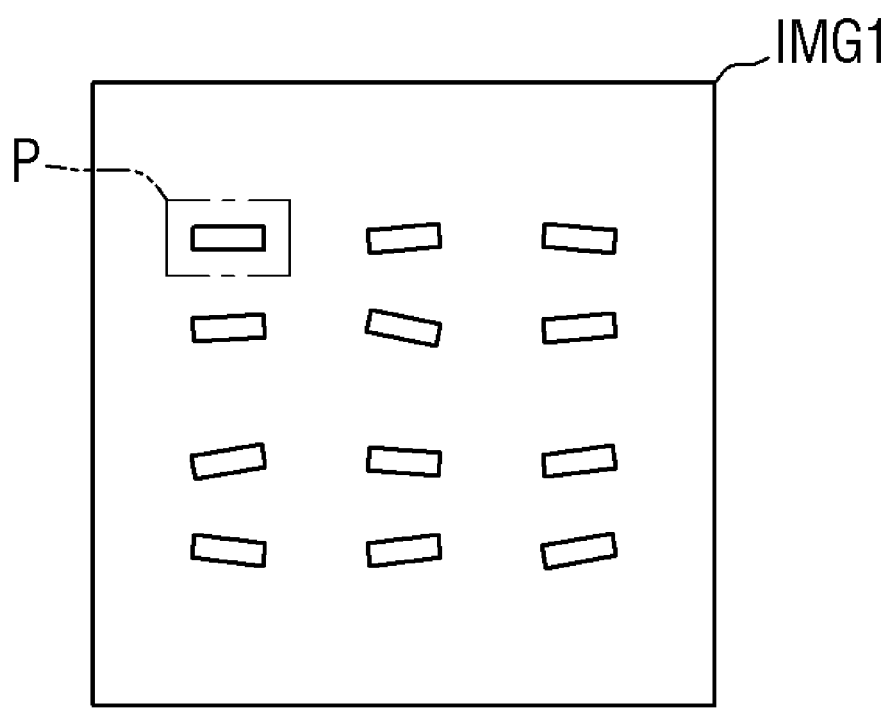
FIG. 13A shows an example of a spectrum image generated by capturing, in an optical measurement unit, a target substrate magnified by a microscope.
Figure 13B:
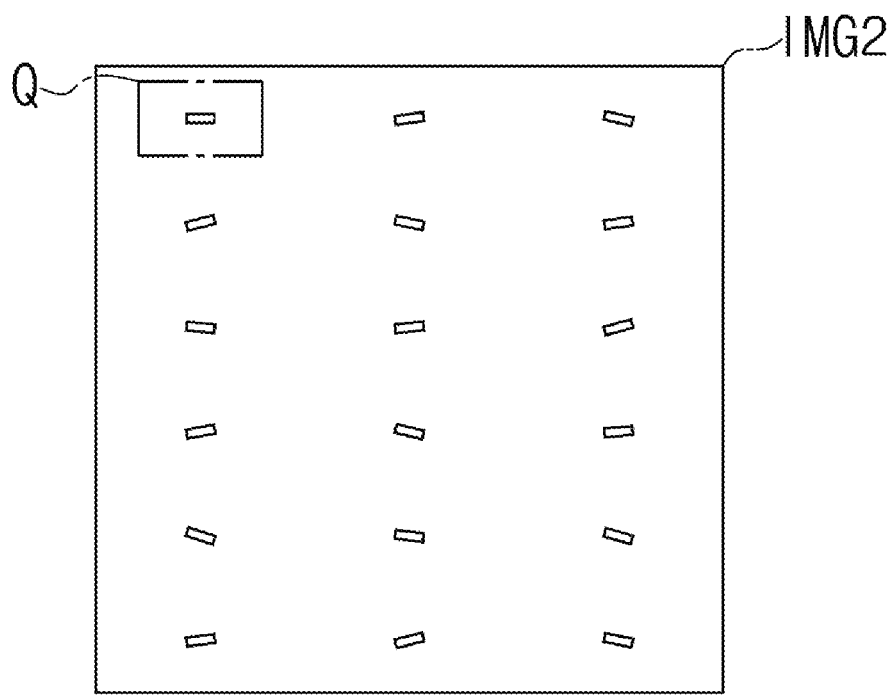
FIG. 13B shows an example of a spectrum image generated by capturing, in an optical measurement unit, a target substrate without being magnified by a microscope.
Figure 14A:
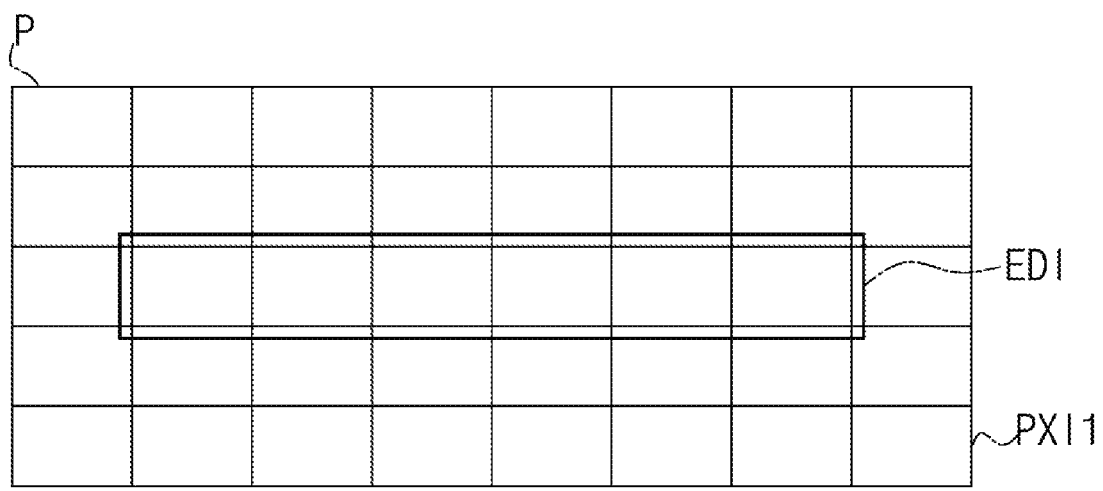
FIGS. 14A and 14B are enlarged views for comparing sizes of pixel and light emitting element images of FIGS. 13A and 13B.
Figure 14B:
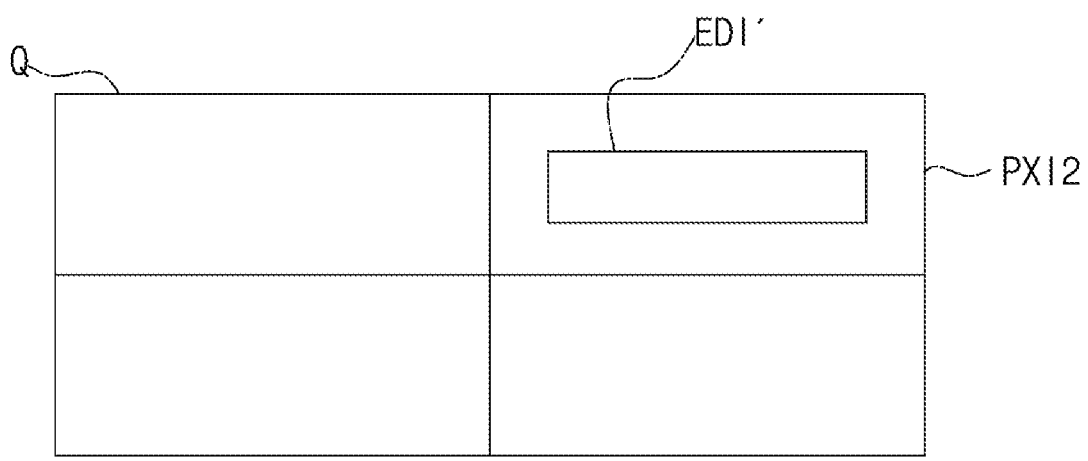
Figure 15:
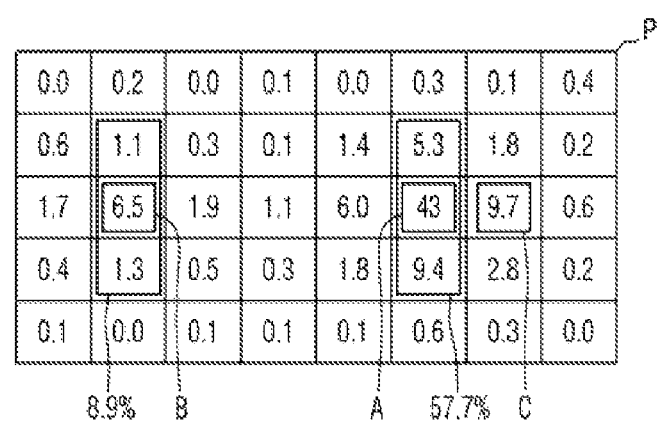
FIG. 15 shows an example of per-pixel luminance distribution in area P of FIG. 13A.

FIG. 13A shows an example of a spectrum image generated by capturing, in an optical measurement unit, a target substrate magnified by a microscope. FIG. 13B shows an example of a spectrum image generated by capturing, in an optical measurement unit, a target substrate without being magnified by a microscope. FIGS. 14A and 14B are enlarged views for comparing sizes of pixel and light emitting element images of FIGS. 13A and 13B. FIG. 15 shows an example of per-pixel luminance distribution in area P of FIG. 13A.

Hereinafter, descriptions are made of the relative sizes of pixels and light emitting elements in the spectrum image generated by the optical measurement unit with reference to FIGS. 13A, 13B, 14A, and 14B.

FIG. 13A may be a first spectrum image IMG1 obtained by capturing one or a surface of the target substrate SUB magnified with the optical measurement unit 300 and the microscope 200. FIG. 13B may be a second spectrum image IMG2 obtained by capturing one or a surface of the target substrate SUB only with the optical measurement unit 300 with no use of the microscope 200. The first and second spectrum images IMG1 and IMG2 obtained by capturing one or a surface of the target substrate SUB magnified with the optical measurement unit 300 and one or a surface of the non-magnified target substrate SUB may be mono images of the target substrate SUB. FIG. 14A may be an enlarged spectrum image showing an enlarged view of area P in the first spectrum image IMG1 of the FIG. 13A, and FIG. 14B may be an enlarged spectrum image showing an enlarged view of area Q in the second spectrum image IMG2 of the FIG. 13B.

Meanwhile, in the case where the optical measurement unit 300 is a 2D spectroscope as described above, the optical measurement unit 300 may measure per-pixel optical characteristic values of the pixels included in the generated spectrum image. For example, the per-pixel optical characteristic value may be measured by averaging the optical characteristic values detected in an area corresponding to each pixel, for example, luminance or wavelength of the detected light.

One pixel PXI1 of the first spectrum image IMG1 obtained by capturing image data of the surface of the target substrate SUB magnified with the microscope 200 and the optical measurement unit 300 may be smaller in size than an image pattern EDI corresponding to the light emitting element ED in the first spectrum image IMG1 as shown in FIG. 14A. Because the size of one pixel PXI1 of the first spectrum image IMG1 is less than the size of the image pattern EDI corresponding to the light emitting element ED, it may be possible to measure per-location optical characteristic value of the light emitting element ED that corresponds to each pixel PXI1.

In contrast, one pixel PXI2 of the second spectrum image IMG2 obtained by capturing one or a surface of the target substrate SUB only with the optical measurement with no use of the microscope 200 may be larger in size than an image pattern EDI' corresponding to the light emitting element ED in the second spectrum image IMG2 as shown in FIG. 14B. Because the size of one pixel PXI2 of the second spectrum image IMG2 is greater than the size of the image pattern EDI' corresponding to the light emitting element ED, the optical characteristic may be measured by averaging the optical characteristics on the outside of the light emitting element ED as well as the inside of the light emitting element ED within each pixel PXI2. In this case, because the measured optical characteristic value may not exactly correspond to one light emitting element ED, the measurement accuracy of the per-location optical characteristics of the light emitting element ED or the optical characteristic per light emitting element ED may not be high.

Because the optical measurement unit 300 measures the average value of the optical characteristics detected in an area corresponding to each pixel of the spectrum image generated by the optical measurement unit 300, it may be necessary for the image pattern corresponding to the light emitting element ED to be larger in size than each pixel in the spectrum image generated by the optical measurement unit 300, which may make it possible to improve the per-location optical characteristic measurement accuracy of the light emitting element ED. Accordingly, it may be necessary to adjust the magnification of the microscope 200 in order for the size of one pixel of the spectrum image generated by the optical measurement unit 300 to be smaller than the image pattern corresponding to a light emitting element ED, thereby generating the first spectrum image IMG1 as shown in FIGS. 13A and 14A.

The first spectrum image IMG1 may be identical in magnification with the image data magnified by the lens 220 of the microscope 200. Accordingly, the size of the light emitting element ED included in the image data magnified by the lens 220 may be equal to the size of the image pattern EDI corresponding to the light emitting element ED in the first spectrum image IMG1. Accordingly, it may be possible to measure per-location optical characteristics of the light emitting element ED by adjusting the magnification with the lens 220 in order for the size of the light emitting element ED included in the image data magnified by the lens 220 to be larger than one pixel PXI1 of the first spectrum image IMG1 generated by the optical measurement unit 300 as described above. Accordingly, because the magnification may be adjusted with the lens 220 to measure per-location luminance characteristics along the extending direction of the light emitting element ED, the size of one pixel PXI1 of the first spectrum image IMG1 generated by the microscope 200 and the optical measurement unit 300 may be smaller than the size of the image pattern EDI corresponding to the light emission element ED.

For example, FIG. 15 shows a part of luminance values corresponding to individual pixels PXI1 measured by the optical measurement unit 300 in the first spectrum image IMG1 of FIG. 13A generated by the optical measurement unit 300. FIG. 15 shows luminance values corresponding to the individual pixels PIX1 of area P enlarged in the first spectrum image IMG1 of FIG. 13A. It is shown that pixel A has the highest luminance value among the luminance values of the pixels PXI1 within area P. Because the luminance values of the neighboring pixels arranged or disposed at the upper, lower, left, and right sides of pixel A may have luminance values greater than those of other pixels, it may be possible to expect that the active layer 36 of the light emitting element ED may be located or disposed at pixel A based on such optical characteristic data. Given that pixels B and C of which luminance values may be relatively greater than those of neighboring pixels thereof may be respectively located or disposed at the left and right sides of pixel A and the distance between pixels A and B may be greater than the distance between pixels A and C, it may be possible to expect that the first semiconductor layer 31 of the light emitting element ED may be located or disposed around pixel B and the second semiconductor layer 32 of the light emitting element ED may be located or disposed around pixel C. Because this means that one or an end of the light emitting element ED may be located or disposed at pixel B and the other or another end of the light emitting element ED may be located or disposed at pixel C, it may be possible to measure the per-location luminance characteristics of the light emitting element ED based on the luminance values corresponding to the individual pixels PXI1 from pixel B to pixel C. For example, referring to FIG. 15, a sum of luminance values of pixel A and pixels disposed around the pixel A may be about 57.7%, and a sum of luminance values of pixel B and pixels disposed around the pixel B may be about 8.9.%. Accordingly, it may be possible to measure the luminance characteristics of one or an end of the light emitting element ED in which the first semiconductor layer 31 may be disposed and the luminance characteristics of the other or another end of the light emitting element ED in which the active layer 36 may be disposed can be measured.

Figure 16:
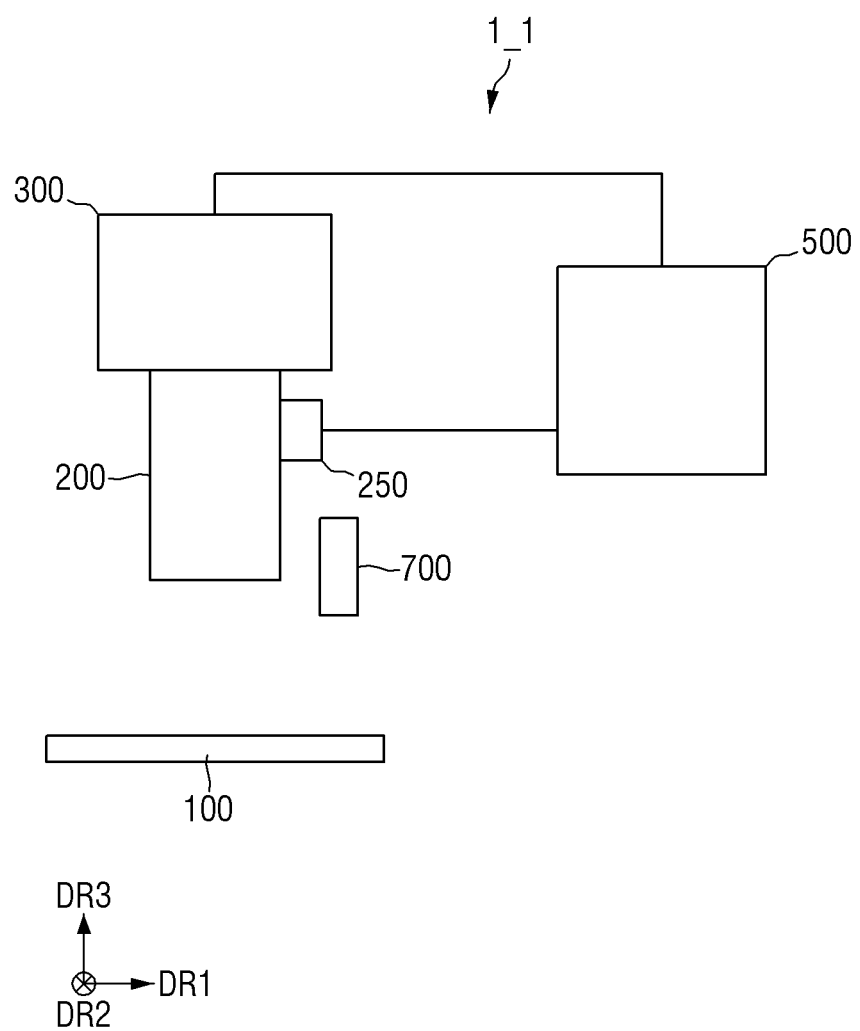
FIG. 16 is a schematic view of an optical inspection apparatus according to an embodiment.
Figure 17:
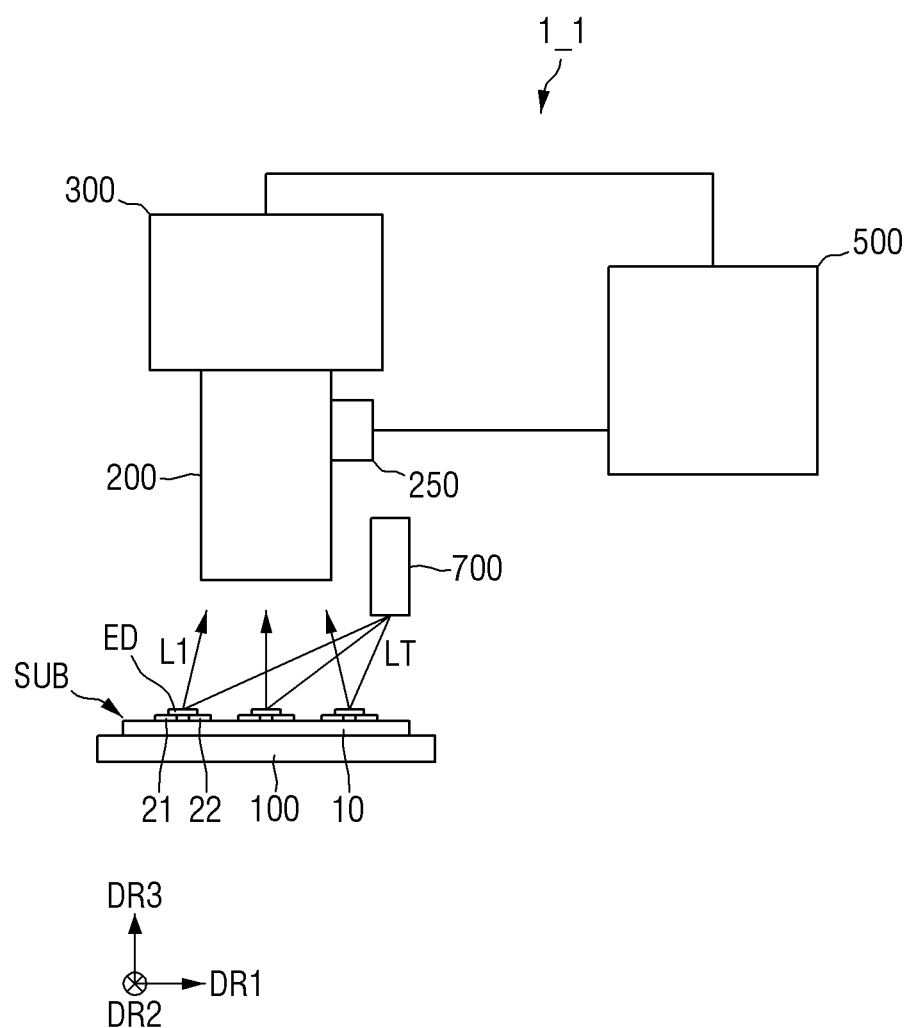
FIG. 17 is a schematic view illustrating an inspection process for inspecting optical characteristics of a target substrate using the optical inspection apparatus of FIG. 16.

FIG. 16 is a schematic view of an optical inspection apparatus according to an embodiment. FIG. 17 is a schematic view illustrating an inspection process for inspecting optical characteristics of a target substrate using the optical inspection apparatus of FIG. 16.

Referring to FIGS. 16 and 17, an optical inspection apparatus 1_1 according to an embodiment may differ from an embodiment of FIG. 2 in that the plurality of light emitting elements ED included in the target substrate SUB may be excited to emit light by light irradiated thereto rather than by applying an electrical signal to the plurality of light emitting elements ED.

In detail, the optical inspection apparatus 1_1 according to an embodiment may include a laser unit 700. The laser unit 700 may irradiate inspection light LT to the light emitting elements ED from above the target substrate SUB. The inspection light LT may include light of a wavelength band shorter than light L1 emitted by the light emitting elements ED. In the case of irradiating, to the light emitting elements ED, the inspection light LT of a wavelength band shorter than that of the light L1 emitted by the light emitting elements ED, the light emitting elements ED may absorb the light energy of the inspection light LT so as to be excited and emit light by irradiating the absorbed light energy while transitioning from an excited state to a ground state. The optical inspection apparatus 1_1 according to an embodiment may exclude the power application unit 400 for supplying an electrical signal to the light emitting elements ED because the inspection light LT irradiated from the laser unit 700 may cause the light emitting elements ED to emit light.

In concluding the detailed description, those skilled in the art will appreciate that many variations and modifications may be made to the embodiments without substantially departing from the principles of the disclosure. Therefore, the disclosed embodiments are used in a generic and descriptive sense only and not for purposes of limitation.

What is claimed is:

1. An optical inspection apparatus comprising:
    a stage that supports a target substrate, the target substrate including a plurality of light emitting elements;
    a jig that applies an electrical signal to the target substrate, the jig including;
    a connector creating an electrical connection with a pad on the target substrate, and
    a regulation resistor that is electrically connected in series between the connector and a power supply;
    a microscope that generates magnified image data of the target substrate;
    a camera that captures the magnified image data to generate a color image of the target substrate; and
    an optical measurement unit that captures the magnified image data of the target substrate to generate a spectrum image and measure optical characteristics of the target substrate.

2. The optical inspection apparatus of claim 1, wherein the spectrum image includes a plurality of pixels, and the optical measurement unit measures an optical characteristic value corresponding to each of the plurality of pixels of the spectrum image.

3. The optical inspection apparatus of claim 2, wherein the microscope includes a plurality of lenses to magnify a surface of the target substrate, and a size of a pixel of the plurality of pixels of the spectrum image is smaller than a size of a light emitting element of the plurality of light emitting elements included in the magnified image data.

4. The optical inspection apparatus of claim 1, wherein the optical measurement unit includes a two-dimensional spectroscope.

5. The optical inspection apparatus of claim 1, wherein a resistance of the regulation resistor of the jig is greater than a resistance of a light emitting element of the plurality of light emitting elements.

6. The optical inspection apparatus of claim 1, wherein
    the target substrate includes a plurality of first pad portions respectively electrically connected to a first electrode of each of the plurality of light emitting elements, and
    the jig includes a plurality of first connectors respectively electrically connected to the plurality of first pad portions.

7. The optical inspection apparatus of claim 6, further comprising:
    a power supply unit that applies an electrical signal to the jig.

8. The optical inspection apparatus of claim 7, wherein the regulation resistor of the jig is electrically connected between each of the plurality of first connectors of the jig and the power supply unit.

9. The optical inspection apparatus of claim 7, wherein
    the target substrate includes a second pad portion electrically connected to a second electrode of the plurality of light emitting elements, and
    the jig includes a second connector electrically connected between the power supply unit and the second pad portion of the target substrate.

10. The optical inspection apparatus of claim 6, wherein a predetermined number of the plurality of light emitting elements are electrically connected between one of the plurality of first pad portions of the target substrate and a second electrode of the plurality of light emitting elements.

11. The optical inspection apparatus of claim 1, further comprising:
    a light path adjusting unit that adjusts a light path of light of the magnified image data of the target substrate to the camera.

12. The optical inspection apparatus of claim 11, further comprising:
    a controller that determines an occurrence of noise in the optical measurement unit,
    wherein the controller receives the color image from the camera, receives the spectrum image from the optical measurement unit, and compares the color image with the spectrum image.

13. The optical inspection apparatus of claim 1, wherein the jig further comprises:
    a surface that causes the target substrate to be fixed on the stage, the connector having a position on the surface; and
    an opening within the surface that exposes a display area of the target substrate to the microscope.

14. The optical inspection apparatus of claim 13, wherein
    the jig comprises a plurality of the connectors having respective positions on the surface that create respective electrical connections with respective pads on the target substrate when fixed, and
    the regulation resistor includes one or more resistor elements electrically connected in series between each of the connectors and the power supply.

15. The optical inspection apparatus of claim 13, wherein the connector creates the electrical connection with the pad at a non-display area of the target substrate when fixed.

* * * * *